April 22, 1969 E. D. WOLLEY 3,440,113

PROCESS FOR DIFFUSING GOLD INTO SEMICONDUCTOR MATERIAL

Filed Sept. 19, 1966

WITNESSES:
Bernard R. Giegue
James F. Young

INVENTOR
Elden D. Wolley
BY
C. L. Menzemer
ATTORNEY

United States Patent Office 3,440,113
Patented Apr. 22, 1969

3,440,113

PROCESS FOR DIFFUSING GOLD INTO SEMICONDUCTOR MATERIAL

Elden D. Wolley, Pitcairn, Pa., assignor to Westinghouse Electric Corporation, Pittsburgh, Pa., a corporation of Pennsylvania Filed Sept. 19, 1966, Ser. No. 580,516
Int. Cl. H01l 7/36, 7/44, 7/50
U.S. Cl. 148—187 5 Claims

ABSTRACT OF THE DISCLOSURE

This disclosure relates to a novel process for diffusing gold into a silicon semiconductor wafer to control minority carrier lifetime within the wafer.

Figure 1:
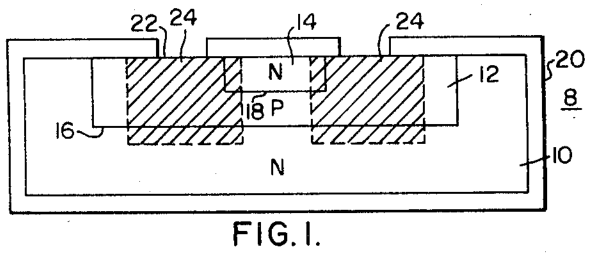

The wafer and gold source, in the form of a gold halide or gold cyanide are sealed within an enclosure and heated whereby the gold source decomposes and the gold diffuses into the wafer.

This invention relates to a new and improved process for diffusing gold into silicon.

Many semiconductor devices and integrated circuits could be made to perform better if the minority carrier lifetime could be selectively controlled. An example of one such device is a PNPN thyristor in which it is desirable to have the minority carrier lifetime high in one base of the device and low in the other. In integrated circuits, it may be desirable to have the minority carrier lifetime low in some devices in order to make them fast, and the minority carrier lifetime high in others in order to have high gain, low reverse leakage or low noise.

Gold is normally used to lower the minority carrier lifetime in silicon since it is an effective recombination center in silicon, has reasonable solubility in silicon, and is a relatively fast diffusant in silicon.

The most commonly used technique for introducing gold into silicon is to plate or evaporate a gold layer onto one or more surfaces of a silicon wafer and then heat the silicon to a temperature suitable to diffuse the required amount of gold into the wafer. Normally the gold is deposited on the side of the wafer in which diffusion depths are not critical and contacts are not complex. For example, the gold is usually deposited on the collector sides of transistors, the substrates of integrated circuits, and the base sides of diodes. This technique is utilized because of the alloying that occurs during the diffusion from the evaporated or plated layers. If the gold is deposited on the active side of the device, the alloying may penetrate shallow diffused regions such as emitters in transistors, thereby destroying or at least reducing the effectiveness of the device.

Since, according to prior art techniques, the gold diffusion is carried out from the substrate side of integrated circuits, planar transistors and the like, it is difficult to localize the diffused gold to any particular region on the other side of the wafer. In addition, the times and temperatures necessary to diffuse the gold through the entire thickness of the wafer often cause changes in the diffusion profiles of the active regions of semiconductor devices. In short, while techniques have been used previously to diffuse gold into silicon wafers, none of these techniques are suitable for diffusing controlled quantities of gold into limited and selected regions of the surface of a silicon wafer which already has shallow diffused regions therein.

As one object, the present invention seeks to provide a new and improved method for diffusing controlled quantities of gold into limited and selected regions of a silicon wafer.

Another object of the invention is to provide a method for vapor diffusing gold into selected and limited areas of a silicon wafer while eliminating the undesirable alloying associated with the solid state diffusions.

Other objects will, in part, be obvious and will, in part, appear hereinafter.

Figure 2:
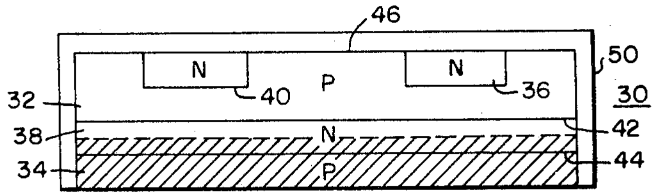

For a better understanding of the nature and objects of the present invention, reference should be had to the following detailed description and drawings in which:

FIGS. 1 and 2 are side views, in section, of semiconductor devices prepared in accordance with the teachings of this invention.

In accordance with the present invention and attainment of the foregoing objects there is provided a process for selectively diffusing gold into preselected portions of a wafer of silicon comprising (1) masking predetermined surface areas of a silicon wafer, said predetermined surface areas being less than the total surface area of the wafer, (2) sealing the wafer and a predetermined quantity of a gold compound selected from the group consisting of gold halides and gold cyanide in an enclosure, and (3) heating the silicon wafer and gold compound within the enclosure for a predetermined time and at a predetermined temperature, whereby the gold compound decomposes to form elemental gold and a radical selected from the group consisting of halides and cyanide, and the gold diffuses into the wafer through an unmasked surface area of the wafer.

In practicing the teachings of the invention, a silicon wafer is first oxidized to form a layer of silicon dioxide on its entire surface. The oxide can be formed, for example, by heating the wafer in wet oxygen or air, or by electrolytic techniques. In order to form a mask on the surface of the wafer in which selected portions of the silicon dioxide coatings are removed, the whole wafer is covered with an organic monomer or photoresist layer which polymerizes when subjected to ultraviolet radiation. Usually, the monomer is applied in liquid form, allowed to dry, and thereafter exposed to ultraviolet light passing through light-transmitting areas of an opaque mask. In this process, the pattern defined by the light-transmitting areas of the mask becomes polymerized. Washing of the coated wafer in a suitable solvent for the monomer removes all but the polymerized area of the photosensitive layer exposed to light. The remaining areas, still covered by the polymer, protect the silicon oxide film during the next process, which is immersion of the wafer in a slow etch, usually consisting of a mixture of hydrofluoric and ammonium fluoride. The etch thus removes the silicon oxide film from all but the areas covered by the polymer. Finally, the remaining polymer is removed with a suitable solvent such as hot sulfuric acid, and the wafer is washed and dried.

In certain cases, the silicon dioxide layer, or even a suitable mask, will exist on the wafer because of previous diffusions, in which case one or more of the foregoing steps can be eliminated.

The gaseous diffusion of gold into silicon using silicon dioxide as a mask will provide the control and selection required to make specialized devices in integrated circuits. However, at the temperature desired for quantitative control of the diffusion, the vapor pressure of elemental gold is not high enough to provide gold in the silicon to adequately control the minority carrier lifetime. In the present invention, these difficulties are eliminated by utilizing a gold halide or gold cyanide which decomposes at the temperature of the diffusion to provide a higher vapor pressure of gold than can be obtained from elemental gold itself. The gold compound is preferably AuCl or $AuCl_3$, but may be a bromide, iodide or cyanide such as AuBr, $AuBr_3$, AuI, $AuI_3$ or AuCN of gold. The major requirement of the gold compound is that it will decompose at temperatures above 100° C. into elemental gold and the halide or cyanide. Decomposition below this temperature would, of course, make handling at room temperatures difficult.

The silicon wafers having oxide masks formed thereon in the manner described above is placed within an enclosure, preferably a quartz ampule, along with a quantity of one or more of the gold compounds mentioned above, the amount of the gold compound being sufficient to supply enough gold to perform a diffusion to the required depth and density. Upon heating, the gold compound will break down into elemental gold and a halide or cyanide, with the gold diffusing into the exposed or unmasked areas of the silicon wafer.

The vapor pressure of the gold can be controlled by the amount of compound in the sealed quartz capsule. In this respect, the concentration of gold obtainable from 0.1 mg. of $AuCl_3$, for example, in a 10 cubic centimeter tube is compared with that over solid gold at several temperatures in Table I.

TABLE I

| T., ° C. | T., ° K. | C(sub)$_s$ (cm.$^{-3}$) | $P_{Au}$ (torr) | $N_{Au}(V)$ (cm.$^{-3}$) | $N_{Au}(G)$ (cm.$^{-3}$) |
|---|---|---|---|---|---|
| 827 | 1,100 | $8\times10^{14}$ | $2\times10^{-8}$ | $1.8\times10^{8}$ | $2\times10^{16}$ |
| 927 | 1,200 | $1.5\times10^{15}$ | $6\times10^{-7}$ | $5\times10^{9}$ | $2\times10^{16}$ |
| 1,027 | 1,300 | $9\times10^{15}$ | $10^{-5}$ | $8\times10^{10}$ | $2\times10^{16}$ |
| 1,127 | 1,400 | $1.7\times10^{16}$ | $10^{-4}$ | $7\times10^{11}$ | $2\times10^{16}$ |
| 1,227 | 1,500 | $8.5\times10^{16}$ | $7\times10^{-4}$ | $5\times10^{12}$ | $2\times10^{16}$ |

C(sub)$_s$=$8.15\times10^{22}$ exp(−40.6 kcal/RT)=substitutional solubility of Au in silicon.

$P_{Au}$=—Pressure of Au over elemental Au.

$N_{Au}(B)=P_{Au}/kT$=density of Au atoms over Au.

$N_{Au}(G)=6\times10^{23}/nV$=density of Au atoms from $AuCl_2$ assuming total decomposition, 10 cm.$^3$ tube volume (V) and 0.1 mg. $AuCl_3$.

n=Mole wt. ($AuCl_3$)/wt. ($AuCl_3$)=number of moles of $AuCl_3$.

Also shown in Table I is the substitutional solid solubility of gold in silicon. From the table, it will be seen that solid solubility cannot be achieved by merely having elemental gold in the same tube with silicon unless the partition function between the vapor phase and silicon surface is very large (i.e., on the order of $10^4$ to $10^6$).

In order to carry out a successful diffusion process in accordance with the invention, the gold compound and the silicon wafer must be heated within the quartz ampule to a temperature of at least 700° C. and preferably at least 850° C.

The silicon wafers having an oxide mask formed on preselected areas thereof is loaded into a clean quartz capsule or the like with a small amount of $AuCl_3$, AuCl, $AuBr_3$, AuBr, AuI, $AuI_3$, AuCN or a mixture of these. The capsule is evacuated until a vacuum of approximately $10^{-5}$ torr is obtained. Thereafter, the quartz capsule is sealed. During the sealing process, it is necessary to cool the end of the tube where the gold compound is placed in order to prevent evaporation of the gold compound halide.

The sealed quartz tube is then placed in a preheated furnace at a temperature of at least 700° C. The diffusion time will ordinarily vary from about 5 to 120 minutes; however a period of 30 minutes has been used most frequently and has provided the best results. Heating times below 5 minutes make it difficult to control the gold diffusion profile. Since gold diffuses rapidly in silicon, and since its solubility decreases with temperatures below 800° C., the distribution of gold may be affected by the cooling rate in addition to the time and temperature of the gold diffusion. At the end of the diffusion, therefore, the tube containing the diffused silicon wafer is quenched, either in water or on an air cooling rack.

The diffusion length of the gold penetration at a diffusion temperature of 850° C. and a time of 30 minutes, for example, is 1.7 mils according to theoretical calculations. Furthermore, the solubility of gold in silicon at 850° C., according to theoretical calculations, is approximately $2\times10^{-16}$ cm.$^{-3}$. In actual experiments utilizing the foregoing conditions, gold was diffused into 20 ohm centimeter N-type silicon material and the diffusion profile determined by the spreading-resistance-profile technique. The experimental data fit a complimentary error function with a surface concentration of $4\times10^{14}$ cm.$^{-3}$ and a diffusion length of 1.6 mils, which is in reasonable agreement with the theoretical data given above.

The silicon dioxide mask is an excellent barrier to protect the wafer from gold diffusion at unwanted areas. For example, when 20 ohm centimeter N-type silicon wafers, protected with 7000 Angstrom units and 17,000 Angstrom units of thermally grown silicon dioxide, were put through the gold diffusion procedure of the invention, no penetration of the oxide by the gold was detected as determined by type change, or change in resistivity measured by both a four point probe and a spreading resistance probe.

One type of gold-diffused semiconductor device prepared in accordance with the teachings of this invention is shown in FIG. 1.

The device 8, a transistor comprises a wafer of N-type silicon 10 having a P-type region 12 and an N-type region 14. There as a p-n junction 16 between regions 10 and 12 and a p-n junction 18 between regions 12 and 14. A layer 20 of silicon dioxide is deposed over predetermined surface portions of the device 8. There is an annular window 22 formed in the oxide mask layer 20 around the central N-type region 14 and above a portion of the P-type region 12. The wafer is placed in an enclosure, such as a quartz capsule, together with a quantity of $AuCl_3$, for example, and heated to a temperature of about 850° C. for 30 minutes. In this process, the gold diffuses into the silicon through the annular window 22, thereby forming an annular diffused gold region 24. This annular gold region is diffused primarily in the P-type base region 12 in order to reduce the storage time with a minimum increase in collector leakage current and a possible increase in low current gain.

Another device processed in accordance with the teachings of the invention is shown in FIG. 2. In this case, the device 30 is an npnp thyristor. The device 30 is comprised of P-type regions 32 and 34 and N-type regions 36 and 38. There is a p-n junction 40, between regions 32 and 36, a p-n junction 42 between regions 32 and 38 and a p-n junction 44 between regions 34 and 38.

Upper surface 46 of the P-type region 32 comprises the gate of the thyristor; N-type region 36 comprises the cathode emitter; and the P-type region 34 is the anode emitter.

A layer 50 of silicon dioxide is disposed around the entiee periphery of the device 20. The top of the wafer and the sides thereof are then coated with Apiezon wax, and the oxide is removed from the underside of the wafer by etching in hydrofluoric acid. The wax is then removed from the upper surface and the sides of the wafer, and the wafer degreased in trichloroethylene and rinsed in acetone, alcohol and water, in that order. The wafer is then dried under a heat lamp and lowered into a clean quartz capsule with a small amount of $AuCl_3$, for example. The quartz tube is then evacuated and sealed in the manner described above and heated to a temperature of about 850° C. for 30 minutes. In this process, gold diffuses into the wafer through region 34 of the device shown in FIG. 2, forming a gold diffusion region projecting into the N-type region 38.

The gold lowers the lifetime in the region of the P-type anode emitter 34 and the tail of the gold diffusion which projects into the N-type base 38 lowers the lifetime in the base. The result is that the holding current is increased because of increased recombination current in the lower anode emitter and, to some extent, the transport in the N-type base 38 is lowered. This increased holding current makes the forward blocking voltage of the device less temperature sensitive and the load current need not be reduced to as low a value to insure that the device is off. As will be understood, this reduces the total time required for turn-off. The fact that the tail of the gold diffusion extends into the N-type base 38 can be used to adjust the transport of minority carriers in that region; and, depending on the transport before gold diffusion, to enhance the turn-off current gain. Further, the lower lifetime decreases the fall time of the turn-off of the thyristor. The width of the N-type base 38 and the gold diffusion length can be adjusted so that the lifetime is not too low in the depletion region of the junction 42. Thus, the leakage current due to generation currents will remain low, assuring high breakover voltage and low degradation of voltage with temperature.

Although the invention has been described in connection with certain specific examples, and examples of devices which can be manufactured in accordance with the invention, it will be readily apparent to those skilled in the art that various changes in procedure can be made to suit requirements without departing from the spirit and scope of the invention.

I claim as my invention:

1. In a process for fabricating a semiconductor device the steps comprising:

(1) masking predetermined surface areas of a silicon wafer, said wafer containing at least one p-n junction said predetermined surface area being less than the total surface area, (2) sealing the wafer and a predetermined quantity of gold compound selected from the group consisting of gold halide and gold cyanide in an enclosure, and (3) heating the silicon wafer and gold compound within the enclosure for a predetermined time at a predetermined temperature, whereby the gold compound decomposes to form elemental gold and a radical selected from the group consisting of halides and cyanide and the gold diffuses into the wafer through the unmarked surface area of the wafer.

2. The process of claim 1 in which the gold compound is $AuCl_3$.

3. The process of claim 1 in which the gold compound is AuCl.

4. The method of claim 1 wherein said wafer and compound are heated for at least five minutes.

5. The method of claim 1 including the step of quenching said enclosure containing the wafer after diffusion.

References Cited

UNITED STATES PATENTS

| | | | |
|---|---|---|---|
| 3,013,955 | 12/1961 | Roberts | 148—187 X |
| 3,067,485 | 12/1962 | Ciccolella et al. | 148—186 X |
| 3,109,760 | 11/1963 | Goetzberger | 148—186 |
| 3,244,566 | 4/1966 | Mann et al. | 148—186 |

L. DEWAYNE RUTLEDGE, *Primary Examiner.*

R. LESTER, *Assistant Examiner.*

U.S. Cl. X.R.

117—107.2, 200, 212; 148—186, 187, 189, 190